(12) United States Patent
Wolf

(10) Patent No.: US 6,725,409 B1
(45) Date of Patent: Apr. 20, 2004

(54) DSP INSTRUCTION FOR TURBO DECODING

(75) Inventor: Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 469 days.

(21) Appl. No.: 09/607,773

(22) Filed: Jun. 30, 2000

(51) Int. Cl.$^7$ .............................................. H03M 13/00
(52) U.S. Cl. ...................................... 714/755; 714/759
(58) Field of Search ......................... 708/270; 714/796, 714/755, 792, 790, 746, 786, 699, 759; 701/102; 375/316, 340, 265, 262; 712/1–4, 208, 35, 34, 32, 223–226; 711/100, 117, 118, 125

(56) References Cited

U.S. PATENT DOCUMENTS 5,574,645 A * 11/1996 Meeker et al. .............. 701/102
6,516,437 B1 * 2/2003 Van Stralen et al. ........ 714/755

OTHER PUBLICATIONS

Humphries et al. (Industrial Electronics, 4th Ed., pp. 5–7; 1993).*

* cited by examiner

Primary Examiner—Guy J. Lamarre
(74) Attorney, Agent, or Firm—Robert D. Marshall, Jr.; W. James Brady, III; Frederick J. Telecky, Jr.

(57) ABSTRACT

The addition of a specialized instruction to perform the MAX star function provides a way to get better performance turbo decoding on a digital signal processor. A subtractor forms the difference between inputs A and B. The sign of this difference controls a multiplexer selection of the max function maximum of inputs A and B. The difference is applied to a lookup table built to handle both positive and negative inputs. The look up table output is summed with with the difference to form the MAX star result. The size of the lookup table is selected to match the required resolution.

6 Claims, 6 Drawing Sheets

US 6,725,409 B1

DSP INSTRUCTION FOR TURBO DECODING

FIELD OF THE INVENTION

This invention relates in general to Digital Signal Processor (DSP) Cores and more specifically to a DSP Instruction for Turbo Decoding.

BACKGROUND OF THE INVENTION

Turbo coders are one type of forward error correction (FEC) used in today's communication systems. They are starting to become widely used in many applications such as: wireless handsets, wireless base stations, hard disk drives, wireless LANs, satellites, and digital television Their bit error rate (BER) performance is closer to the Shannon limit as compared with other types of FECs, as is illustrated in FIG. 2. Turbo coders work on blocks of data called frames. There are two main wireless standards 3GPP and CDMA2000. The frame size for 3GPP ranges from 40 to 5114 bits and the frame size for CDMA2000 ranges from 378 to 20,730 bits. One implementation of a turbo decoder was designed to run in parallel with the TI C64X DSP, with the DSP executing all of the communication algorithm in software except for turbo decoding. The DSP would download a frame of data to the turbo decoder and start the decode. After the decode is complete, the decoder will interrupt the DSP with either a hard or soft interrupt. Next, the DSP retrieves the corrected frame and continues executing the remaining parts of the communication algorithm. The data entering the decoder is soft and is assumed to be quantized to 8 bits in this example. The data exiting the decoder is hard and is binary. The turbo decoder will attempt to find and fix as many errors as possible. Turbo decoders achieve good results by iteratively decoding the data in the frame many times. Typical number of iterations can range from 1 to 100. Typically, the results get better at each iteration until the optimum solution is obtained.

An illustrative example of wireless handset or base station is illustrated in FIG. 1, wherein digital hard data is modulated and transmitted from the transmitter portion of the wireless base station and soft data is received at the receiver portion of the wireless base station. As illustrated, noise is introduced between the transmitter and receiver and as a result, errors in the received data make the received data soft, i.e., "0.9", "−0.2", instead of the transmitted modulated data "1" or "−1". The encoder is typically located in a transmitter of a wireless base station, for example, where the decoder is typically located in the receiver base station.

An example of a rate ⅓ parallel concatenated encoder is shown in FIG. 3. The encoder illustrated in FIG. 3 is a rate "⅓" parallel concatenated encoder due to one input stream and three output streams. The "I" block in FIG. 3 is an interleaver which randomly scrambles the information bits to decorrelate the noise from the decoder. Included in FIG. 3 are two Recursive Systematic Convolutional (RSC) encoders running in parallel. The interleaver located in the encoder scrambles the information in the same way that the interleaver located in the decoder (illustrated in FIG. 6) must unscramble the information. Therefore the scrambling can take any form or use any algorithm as long as both the encoder and the decoder use the same scrambling method.

The functional block diagram of the turbo decoder is shown in FIG. 6. The frame entering the decoder contains systematic and parity symbols x', $p'_0$ and $p'_1$, respectively. These symbols are scaled once by the DSP and stored in separate memories within the turbo decoder. Turbo decoding achieves an error performance close to the Shannon limit. The performance is achieved through decoding multiple iterations. Each iteration results in additional performance and additional computational delay. Turbo codes consist of a concatenation of convolutional codes, connected by an interleaver, with an iterative decoding algorithm. The iterative decoder generates soft decisions from a maximum-a-posteriori (MAP) block. Each iteration requires the execution of two MAP decodes to generate two sets of extrinsic information. The first MAP decoder uses the non-interleaved data as its input and the second MAP decoder uses the interleaved data. The frame of input data entering the decoder contains systematic x' and parity symbols $p'_0$ $p'_1$. There are N of these symbols and they are soft (not binary). The symbols are scaled once and stored in memory. The scaled symbols are labeled $\Lambda(x)$, $\Lambda(p_0)$, and $\Lambda(p_1)\tau$ in the above figure. These inputs are constant for the entire decode of that block of data.

The input to the upper MAP decoder is $\Lambda(x)$, $\Lambda(p_0)$ and $A_2$. $A_2$. is the apriori information from the lower MAP decoder. The output of the upper MAP decoder is the first extrinsic or $W_1$. $W_1$ is interleaved to make $A_1$. The input to the lower MAP decoder is $\Lambda(x)$, $\Lambda(p_1)$ and $A_1$. The output of the lower MAP decoder is the second extrinsic or is $W_2$. $W_2$ is deinterleaved to make $A_2$. This completes one iteration.

The map decoder function is to determine the logarithm of likelihood ratio (LLR). This is commonly called the extrinsic and labeled as $W_1$ and $W_2$ in FIG. 6. The extrinsic associated with each decoded bit $x_n$ is $$W_n = \log \frac{Pr(x_n = 1 \mid R_1^n)}{Pr(x_n = 0 \mid R_1^n)}$$

where $R_1^n = (R_0, R_1, \ldots R_{n-1})$ denotes the received symbols as received by the decoder. The MAP decoder computes the a posteriori probabilities:

$$Pr(x_n = i \mid R_1^n) = \frac{1}{Pr(R_1^n)} \sum (x_n = i, S_n = m, S_{n-1} = m')$$

Here $S_n$ refers to the state at time n in the trellis of the constituent convolutional code. The code rate ⅓ encoder of FIG. 4 trellis is shown in FIG. 5. FIG. 3 shows the two encoders of FIG. 4 in which the second parity is punctured (or not used), connected in parallel. FIG. 4 illustrates the logic gates and registers. The encoder has a code rate of "⅓" because there are three outputs for one input. The 3 bit representations to the far left of the trellis represent the values stored within the three registers, one bit for each register, respectively. The number just to the right of those three bit representations are the states, $S_n$, within the trellis of which there are 8 possible as there are three registers which can be either a '1' or a '0' bit, i.e. $2^3 = 8$. The trellis depicts the output of the RSC encoder in dependence upon the initial state, $S_n$, of the encoder, the values which are stored in the registers, and the input bit. For example, if the initial state of the encoder is state '0' and if all the registers have a "0" located within and the input bit is a "0", then as illustrated in the trellis of FIG. 5, the output will be "000", representing the systematic bit and the two parity bits, respectively. As another example, if the decoder is in state "5" and the registers store "101" respectively and the input bit is a 1, the output is "100".

The terms in the summation can be expressed in the form $$Pr(x_n = l, S_n = m, S_{n-1} = m') = \alpha_{n-1}(m')\gamma^1_n(m',m)\beta_n(m)$$

The following simplified equation is used to calculate α, β and the a posteriori probability(APP) of the bit $x_k$:

$$F = \ln[e^A + e^B]$$

This equation will be called the exponent logarithm equation. For an eight state code, the exponent logarithm equation is executed 8(N+3)times in the generation of both alpha and beta. The 3 in the (N+3) is the extra processing associated with the 3 extra tail bits. The exponent logarithm equation is executed 8N times in the generation of the extrinsic. Table 1 lists the number of exponent logarithm equations which are required for several different sizes of N. These numbers are for a non sliding block implementation and are 10% to 15% greater for a sliding block implementation of the MAP decoder.

TABLE 1

| N | α | β | γ | number per MAP | number per iteration | number per 10 iterations |
|---|---|---|---|---|---|---|
| 320 | 2,584 | 2,584 | 2,560 | 7,728 | 15,456 | 154,560 |
| 3,856 | 30,872 | 30,872 | 30,848 | 92,592 | 185,184 | 1,851,840 |
| 5,120 | 40,984 | 40,984 | 40,960 | 122,928 | 245,856 | 2,458,560 |

The exponent logarithm equation requires two exponent functions, one addition, and one logarithm function. The exponent and logarithm functions are usually not performed on a DSP without the use of lookup tables and these tables can be quite large. One way to rewrite the exponent logarithm equation is as follows:

$$\ln[e^A + e^B] = \max(A, B) + \ln[1 + e^{||A-B|}]$$
$$= \max(A, B) + f(|A - B|)$$

The above equation consists of the MAX function and a small table lookup. This equation is commonly called MAX*, MAX star, or MAX with a table lookup. A subtraction followed by an absolute value are required to generate the index for the table lookup. The MAX, subtraction, and absolute value functions are commonly implemented by DSPS; but the table lookup part for this equation is not. Currently DSPs allocate a block of memory for the table lookup portion. DSPs can execute the MAX, subtraction, addition, and absolute value functions in 1 cycle and the table lookup requires several cycles. The C6x family takes 5 cycles to load an element of the table and other DSPs take a similar number of cycles to perform a load function. On DSPs that have only 1 functional block; the MAX star equation would require 4+5=9 cycles. For DSPs which can execute more than one function at a time; the MAX star equation would take 8 cycles.

The C6x could execute several MAX stars in a rolled loop in which the individual functions are done in parallel. This could possibly reduce the average number of clock cycles to 2 or 3. FIG. 8 shows an example of 8 MAX star functions in a rolled loop. It takes 16 cycles to execute the 8 MAX star functions. The average number of clock cycles has been reduced to 2; but the DSPs 8 functional blocks are kept busy most of the time.

Turbo decoder algorithms for the above reasons are currently implemented on a dedicated chip outside of the DSP. This is due to the high number of MIPs required because of the MAX star function. This extra chip increases the system cost of the entire communication design.

SUMMARY OF THE INVENTION

The addition of a specialized instruction to perform the MAX star function provides a very efficient, low cost way to get better performance on the DSP. The instruction would have two inputs and one output as shown in FIG. 9 and is designed to fit in a standard 3-operand format. This simple instruction is implemented on a DSP to take 1 cycle. FIG. 10 shows one possible implementation of the MAX star function. Signal m1 is the difference between inputs A and B. The sign of m1 controls the multiplexer of the max function. Signal m2 is this result. Signal m1 is applied to a lookup table. The lookup table is built to handle both positive and negative results. Its output is m3 and is summed with m2 to form the MAX star result.

The size of the lookup table depends on the resolution required. FIGS. 11–15 illustrate a few examples of different fixpoint sizes for the lookup table. Implementing the MAX star circuit on a DSP will allow the DSP to execute the MAX star function in 1 clock cycle. This reduction will allow the turbo decoder to run more efficiently on the DSP; therefore reducing the price of the system by eliminating the dedicated turbo decoder chip.

DETAILED DESCRIPTION OF THE PREFERRED EMBODIMENTS

Figure 1:
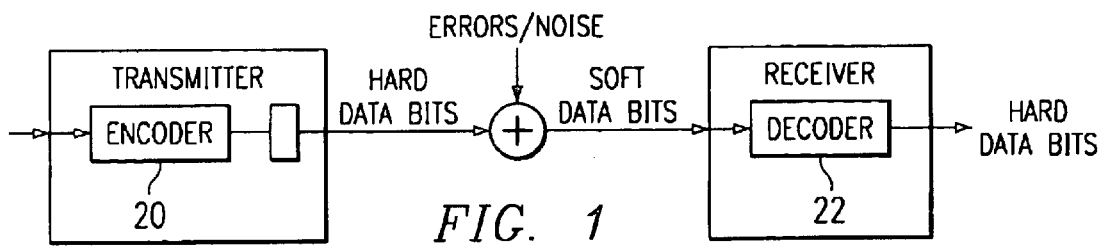
FIG. 1 illustrates a wireless handset or base station, wherein digital hard data is transmitted from the transmitter portion of the wireless base station and received as soft data at the receiver portion of the wireless base station.
Figure 2:
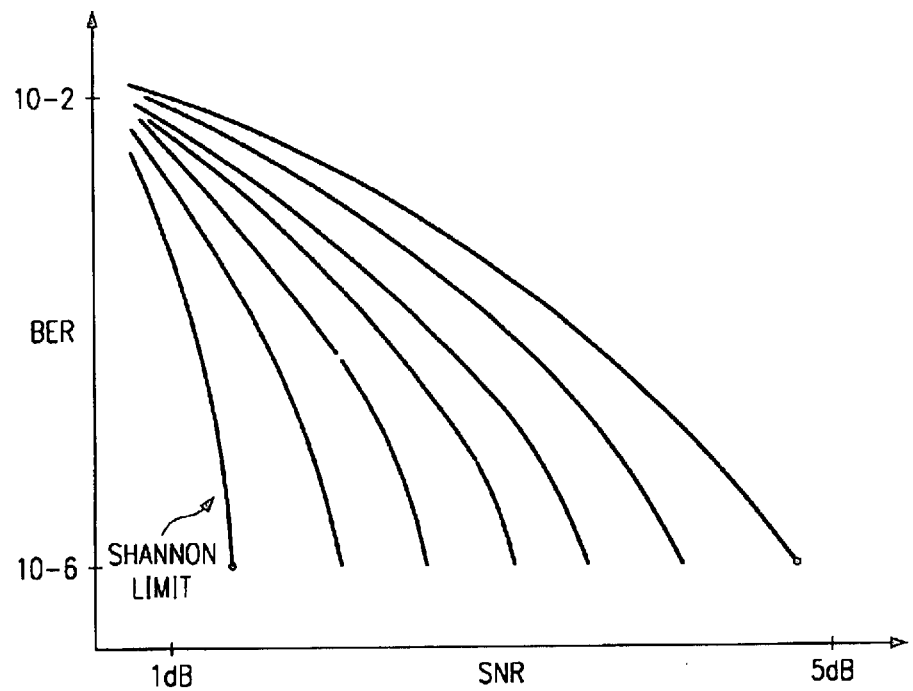
FIG. 2 illustrates the bit error rate (BER) performance versus the signal to noise ration (SNR) where turbo decoding is closer to the Shannon limit as compared with other types of FECs.
Figure 3:
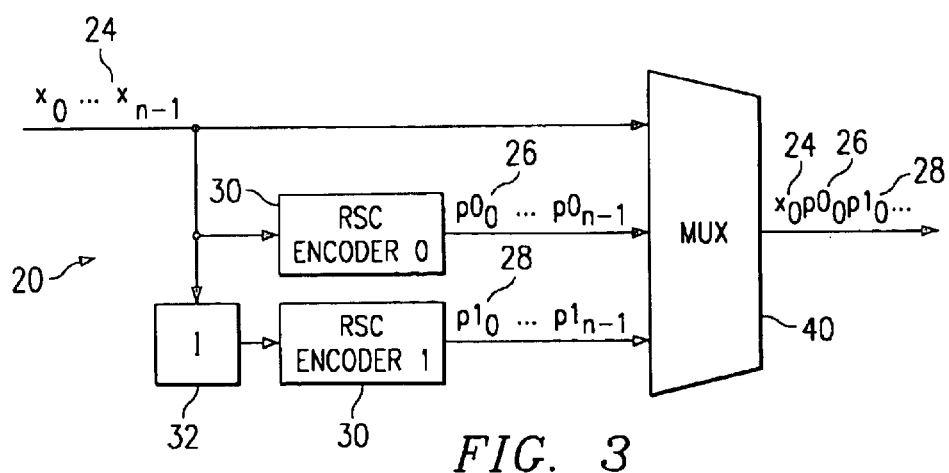
FIG. 3 illustrates an example of a rate ⅓ parallel concatenated encoder.

An example of a rate ⅓ parallel concatenated encoder 20 is shown in FIG. 3. The turbo encoder 20 illustrated in FIG. 3 is a "⅓" parallel concatenated encoder 20 due to one input stream and three output streams. The encoder 20 has one input of information bits and yields three outputs, one of which is the information or systematic bits, $x_n$, 24 the other two outputs are the parity bits, $p0_n$ 26 and $p1_n$ 28. The multiplexer 40 sequences the outputs such that, the encoder 20 outputs first the first information bit, $x_0$, 24 then the unscrambled parity bit, $p0_0$, 26 then the scrambled parity bit $p1_0$ 28 and then back to the second information bit, $x_1$, 24 and so on. So for example, if there are 320 input information bits, then 320×3=960 output bits result. The "I" block in FIG. 3 is an interleaver 32 which randomly scrambles the information bits, x(n),24 to decorrelate the noise for the decoder. Included in FIG. 3 are two Recursive Systematic Convolutional (RSC) encoders 30 running in parallel(the RSC encoders 30 are explained in more detail with regards to FIGS. 4 and 5). The interleaver 32 located in the encoder 30 scrambles the information in the same way that the interleaver 32 located in the decoder 22 (illustrated in FIG. 6) must unscramble the information. Therefore the scrambling can take any form or use any algorithm as long as both the encoder 20 and the decoder 22 use the same scrambling method.

Figure 6:
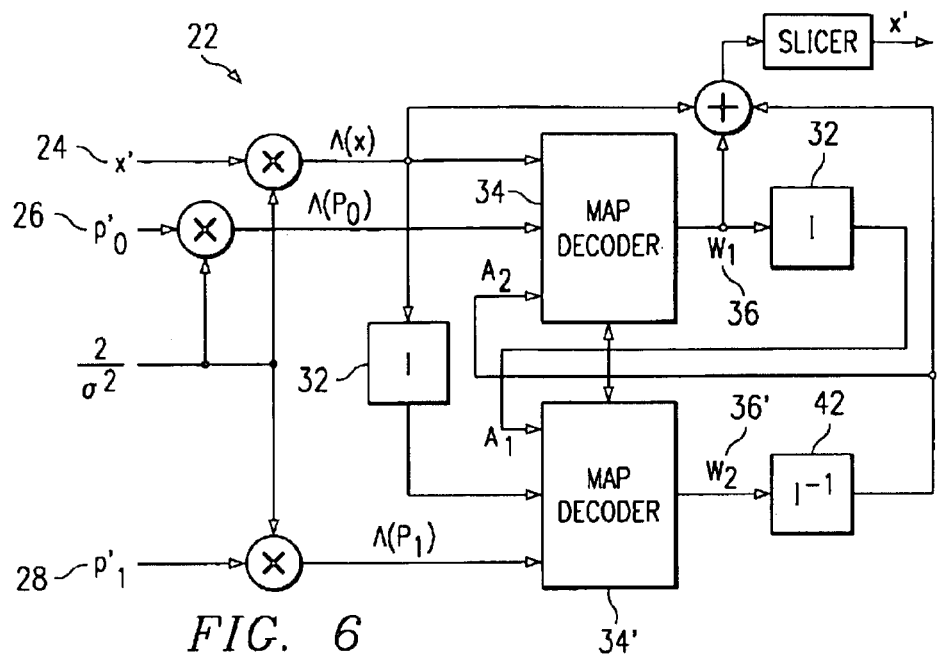
FIG. 6 illustrates the functional block diagram of the turbo decoder.

The functional block diagram of the turbo decoder 22 is shown in FIG. 6. The frame entering the decoder 22 contains systematic and parity symbols x', 24 $p'_0$, 26 and $p'_1$, 28 respectively as received. The symbols have an accent because these are the soft, i.e values of 0.9, −0.1 received signals not the transmitted modulated signals, i.e. values of 0 and 1. These symbols are scaled once by the DSP by multiplying each symbol, x', $p'_0$, and $p'_1$, by the variance of the noise, $2/\sigma^2$, and stored in separate memories within the turbo decoder 22 as intermediate symbols $\Lambda(x)$, $\Lambda(p_0)$, $\Lambda(p_1)$. Turbo decoding achieves an error performance close to the Shannon limit. The performance is achieved through decoding multiple iterations. Each iteration results in additional performance and additional computational delay. Turbo codes consist of a concatenation of convolutional codes, connected by an interleaver, with an iterative decoding algorithm. The iterative decoder generates soft decisions from a maximum-a-posteriori (MAP) block 34. Each iteration requires the execution of two MAP decodes to generate two sets of extrinsic information 36. The first MAP decoder 34 uses the non-interleaved data as its input and the second MAP decoder 34' uses the interleaved data. As previously stated, the frame of input data entering the decoder 22 contains systematic x' and parity symbols $p'_0$ $p'_1$. There are N of these symbols and they are soft (not binary). The scaled symbols are labeled $\Lambda(x)$, $\Lambda(p_0)$, and $\Lambda(p_1)$ and are constant for the entire decode of that block of data.

The input to the upper MAP decoder 34 is $\Lambda(x)$, $\Lambda(p_0)$ and $A_2$. $A_2$. is the apriori information from the lower MAP decoder 34'. The output of the upper MAP decoder 34 is the first extrinsic or $W_1$36. $W_1$ 36 is interleaved in interleaver 32 to make $A_1$ which forms the third input to the second MAP decoder 34'. Therefore, the input to the lower MAP decoder 34' is $\Lambda(x)$, $\Lambda(p_1)$ and $A_1$. The output of the lower MAP decoder 34' is the second extrinsic or is $W_2$. 36'. $W_2$ is deinterleaved in deinterleaver 42 to make $A_2$ as non-interleaved data forms all three inputs to the first MAP decoder 34 and interleaved inputs form all three inputs to the second decoder 34'. The two MAP decoders 34 and 34' are operated in series, with one executing at a time. This completes one iteration.

Figure 4:
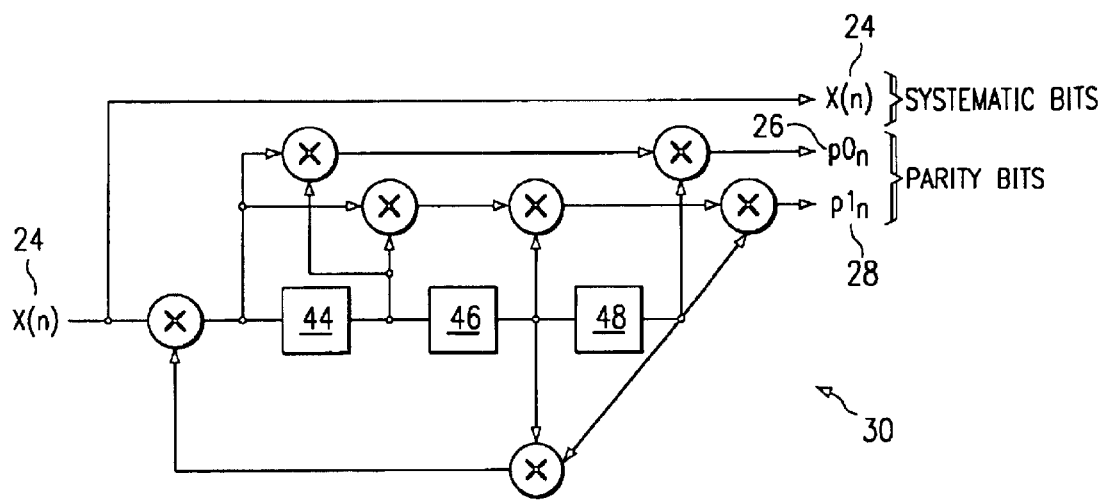
FIG. 4 illustrates the "⅓" RSC encoder of FIG. 3.
Figure 5:
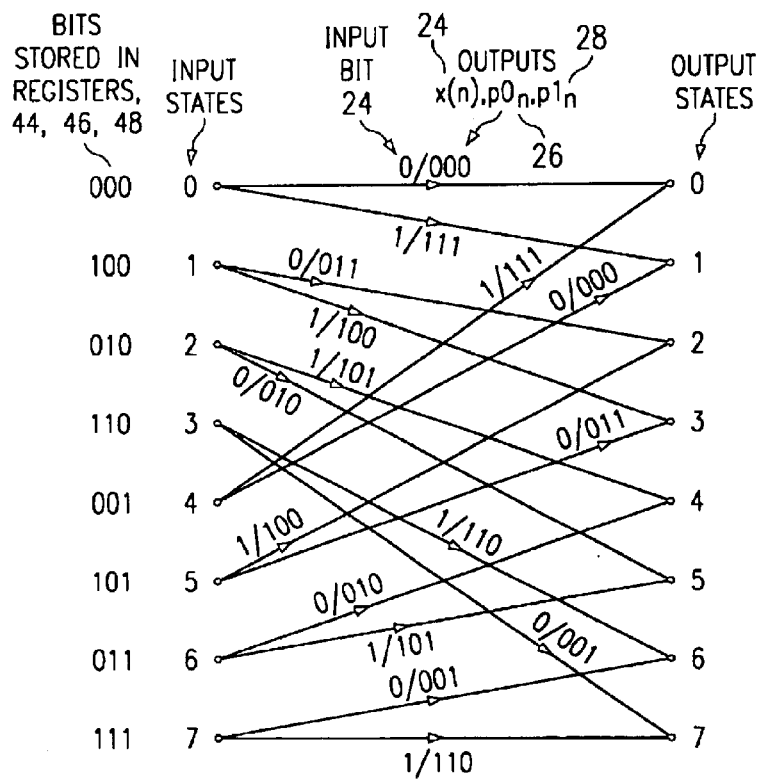
FIG. 5 illustrates the trellis of the constituent convolutional code.

The trellis 54 of the individual constituent convolutional codes is illustrated in FIG. 5. The code rate "⅓×" turbo encoder 20 of FIG. 3 (there are actually two RSC encoders 30) is shown in FIG. 4 illustrating the logic gates and registers giving rise to the trellis 54 illustrated in FIG. 5. The second parity of each RSC encoder 30 is punctured in FIG. 3. The encoder 30 is a code rate "⅓" because there are three outputs forming the two parity outputs 26; 28 and one systematic output 24, creating three outputs total for one input. The 3 bit representations to the far left of the trellis 54 represent the values stored within the three registers 44, 46, 48, one bit for each register, respectively. The number just to the right of those three bit representations are the states, $S_n$, within the trellis 54 of which there are 8 possible as there are three registers 44, 46, 48 which can be either a '1' or a '0' bit, i.e., $2^3$=8. The trellis 54 depicts the output of encoder 30 in dependence upon the initial state, $S_n$, of the encoder 30, the values which are stored in the registers 44, 46, 48, and the input bit 24. For example, if the initial state of the encoder 30 is state '0' and if all the registers, 44, 46, 48 have a "0" located within and the input bit 24 is a "0", then as illustrated in the trellis 54 of FIG. 5, the output will be "000", representing the systematic bit 24 and the two parity bits 26, 28, respectively. As another example, if the decoder 30 is in state "5" and the registers 44, 46, 48 store "101" respectively and the input bit 24 is a 1, the output is "100".

The terms in the summation can be expressed in the form $$Pr(x_n=i, S_n=m, S_{n-1}=m')=\alpha_{n-1}(m')\gamma^1{}_n(m',m)\beta_n(m)$$

where the quantity $$\gamma^1{}_n(m',m)=Pr(S_n=m, x_n=i, R_n|S_{n-1}=m')$$

where
is called the branch metric, $$\alpha_n(m)=Pr(S_n=m, R^n{}_1)$$

is called the forward (or alpha) state metric, and $$\beta_n(m)=Pr(R^N{}_{n-1}|S_n=m)$$

is called the backward (or beta) state metric.

The branch metric depends upon the systematic $X_n$, parity $P_n$ and extrinsic symbols $W_{nj}$. The extrinsic symbols are provided by the other MAP decoder 34'. The alpha and beta state metrics are computed recursively by forward and backward recursions given by $$\alpha_n(m) = \sum_{m',i} \alpha_{n-1}(m')\gamma_n{}^i(m',m)$$

and $$\beta_{n-1}(m') = \sum_{m,i} \beta_n(m)\gamma_n{}^i(m',m)$$

Figure 7:
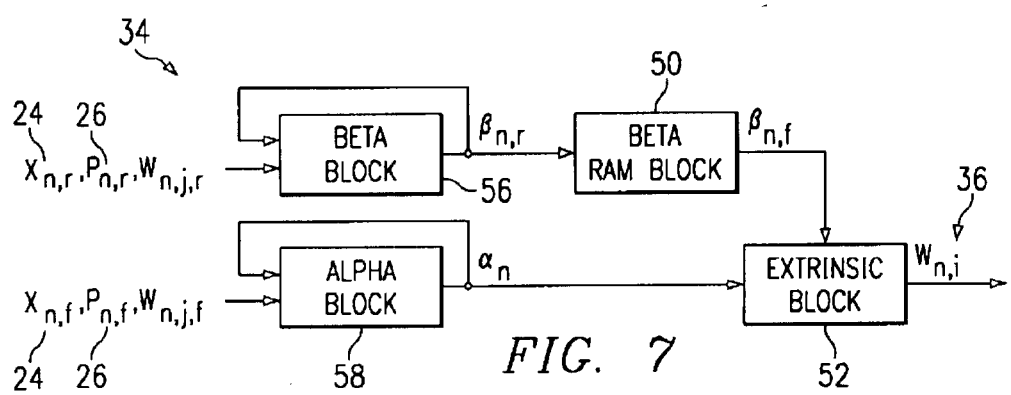
FIG. 7 illustrates the block diagram of the MAP decoder.

The block diagram of the MAP decoder is illustrated in FIG. 7. The subscripts r and f represent the direction of the sequence of the data inputs for the recursive blocks beta and alpha. The f represents the forward direction and r represents the reverse direction.

Both the alpha state metric block 58 and beta state metric blocks 56 calculate state metrics. Both start at a known location in the trellis 54, the zero state, where all the registers 44, 46, 48 are storing zeros. The RSC encoder 30 of FIG. 4 starts the block of n information bits at the zero state and after n cycles through the trellis 54 ends at some unknown state. Tail bits are appended to the encoder data stream to force both encoders 30 back to the zero state. For a constraint length k code, there are t=k−1 systematic tail bits for each RSC encoder 30. For an eight state code, as illustrated in FIGS. 4 and 5, there are three tail bits. For purposes of an illustrative example, t=3 will be used. In addition, the alpha state metric block 58 will process the received data from 0 to n+2, or forwards, and the beta state metric block 56 will process the data from n+2 to 0, or backwards.

The beta state metric block 56 has 11 inputs of $X_{n,r}$, $P_{n,r}$, and $W_{n,j,r}$, plus the 8 beta state metrics $\beta_{n,r}$. The beta state metric block 56 executes before the alpha state metric block 58 and generates n×8 beta state metrics $\beta_{n,r}$(n×8 beta state metrics because of the 8 potential states of the trellis 54).

These metrics are generated in reverse order, $\beta_{n,r}$(the subscript r denotes those inputs supplied as inputs in reverse order) and are stored in reverse order in the beta state metric RAM 50. The alpha state metric block also has 11 inputs of $X_{n,f}$, $P_{n,f}$ and $W_{n,j,f}$ plus the 8 alpha state metrics $\alpha_n$. Next the alpha state metric block 58 executes and generates n×8 alpha state metrics $\alpha_n$(n×8 beta state metrics because of the 8 potential states of the trellis 54). The alpha state metrics $\alpha_n$ are not stored because the extrinsic block 52 uses this data as soon as it is generated. The beta state metrics are read in a forward order $\beta_{n,r}$ at the same time as the alpha state metrics $\alpha_n$ are generated. The extrinsic block 52 will use both the alpha $\alpha_n$ and beta state metrics $\beta_{n,r}$ in a forward order to generate the extrinsic, $W_{n,i}$ 36. This implementation requires a n×8×d RAM where d is the bit precision of the state metric(various bit precision of the metrics are illustrated in FIGS. 11–15). This memory can be huge.

The following simplified equation is used to calculate $\alpha$, $\beta$ and the a posteriori probability(APP) of the bit $x_k$:

$$F = ln[e^A + e^B]$$

This equation will be called the exponent logarithm equation. For an eight state code, the exponent logarithm equation is executed 8(N+3)times in the generation of both alpha and beta. The 3 in the (N+3) is the extra processing associated with the 3 extra tail bits. The exponent logarithm equation is executed 8N times in the generation of the extrinsic. Table 1 lists the number of exponent logarithm equations which are required for several different sizes of N. These numbers are for a non sliding block implementation and are 10% to 15% greater for a sliding block implementation of the MAP decoder 34.

TABLE 1

| N | $\alpha$ | $\beta$ | $\gamma$ | number per MAP | number per iteration | number per 10 iterations |
|---|---|---|---|---|---|---|
| 320 | 2,584 | 2,584 | 2,560 | 7,728 | 15,456 | 154,560 |
| 3,856 | 30,872 | 30,872 | 30,848 | 92,592 | 185,184 | 1,851,840 |
| 5,120 | 40,984 | 40,984 | 40,960 | 122,928 | 245,856 | 2,458,560 |

The exponent logarithm equation requires two exponent functions, one addition, and one logarithm function. The exponent and logarithm functions are usually not performed on a DSP without the use of lookup tables and these tables can be quite large. One way to rewrite the exponent logarithm equation is as follows:

$$ln[e^A + e^B] = max(A, B) + ln[1 = e^{-|A-B|}]$$
$$= max(A, B) + f(|A - B|)$$

The above equation consists of the MAX function and a small table lookup. This equation is commonly called MAX*, MAX star, or MAX with a table lookup. A subtraction followed by an absolute value are required to generate the index for the table lookup. The MAX, subtraction, and absolute value functions are commonly implemented by DSPs; but the table lookup part for this equation is not. Currently DSPs allocated a block of memory for the table lookup portion. DSPs can execute the MAX, subtraction, addition, and absolute value functions in 1 cycle and the table lookup requires several cycles. The C6x family takes 5 cycles to load an element of the table and other DSPs take a similar number of cycles to perform a load function. On DSPs that have only 1 functional block; the MAX star equation would require 4+5=9 cycles. For DSPs which can execute more than one function at a time; the MAX star equation would take 8 cycles.

Figure 8:
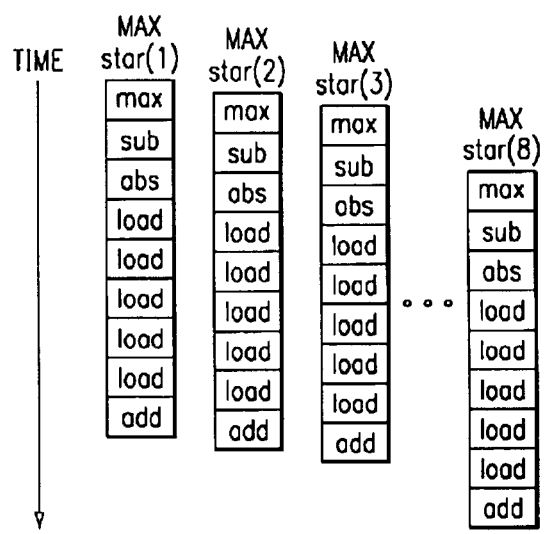
FIG. 8 illustrates an example of a rolled loop for 8 MAX star functions.

The C6x could execute several MAX stars in a rolled loop in which the individual functions are done in parallel. This could possibly reduce the average number of clock cycles to 2 or 3. FIG. 8 shows an example of 8 MAX star functions in a rolled loop. It takes 16 cycles to execute the 8 MAX star functions. The average number of clock cycles has been reduced to 2; but the DSPs 8 functional blocks are kept busy most of the time.

Turbo decoder algorithms for the above reasons are currently implemented on a dedicated chip outside of the DSP. This is due to the high number of MIPs required because of the MAX star function. This extra chip increases the system cost of the entire communication design.

Figure 9:
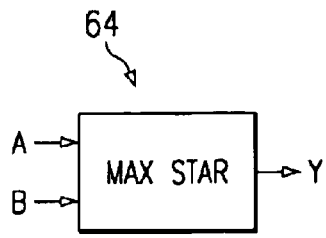
FIG. 9 illustrates the top level diagram of the MAX star function according to a preferred embodiment of the invention.
Figure 10:
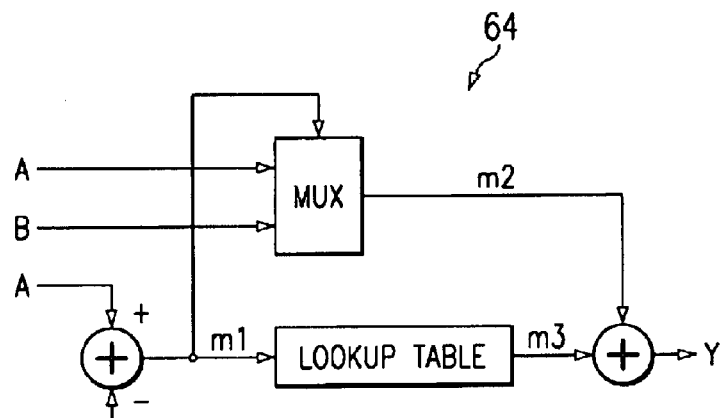
FIG. 10 illustrates the block diagram of the MAX star function according to a preferred embodiment of the invention.
Figure 11:
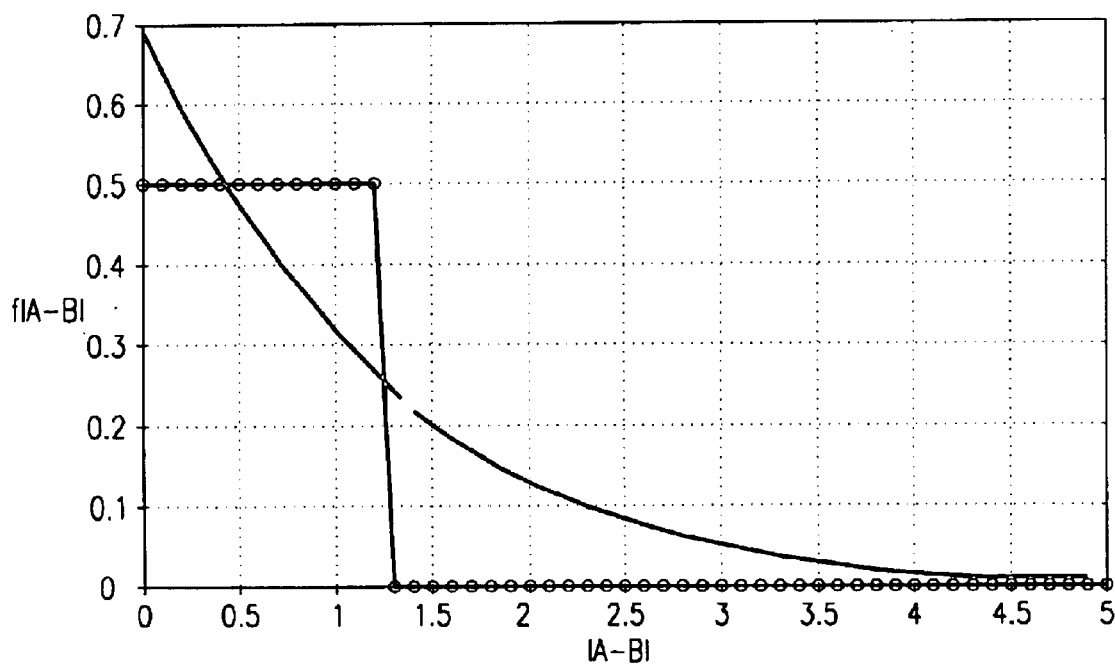
FIGS. 11–15 illustrate a few examples of different fixpoint sizes for the lookup table of FIG. 10.
Figure 12:
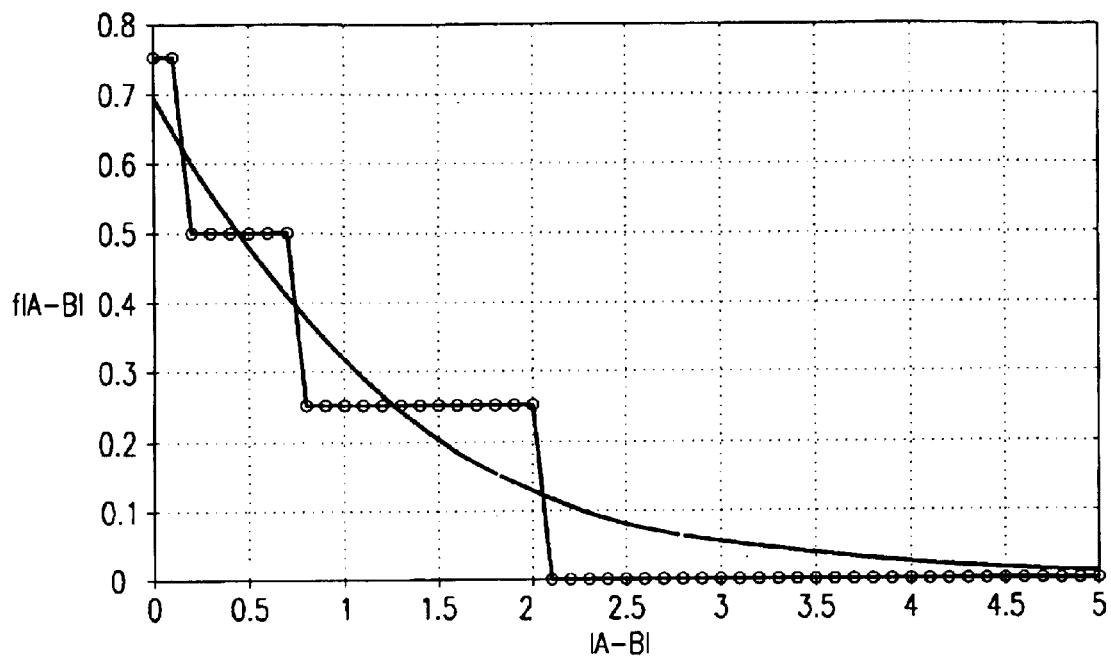
Figure 13:
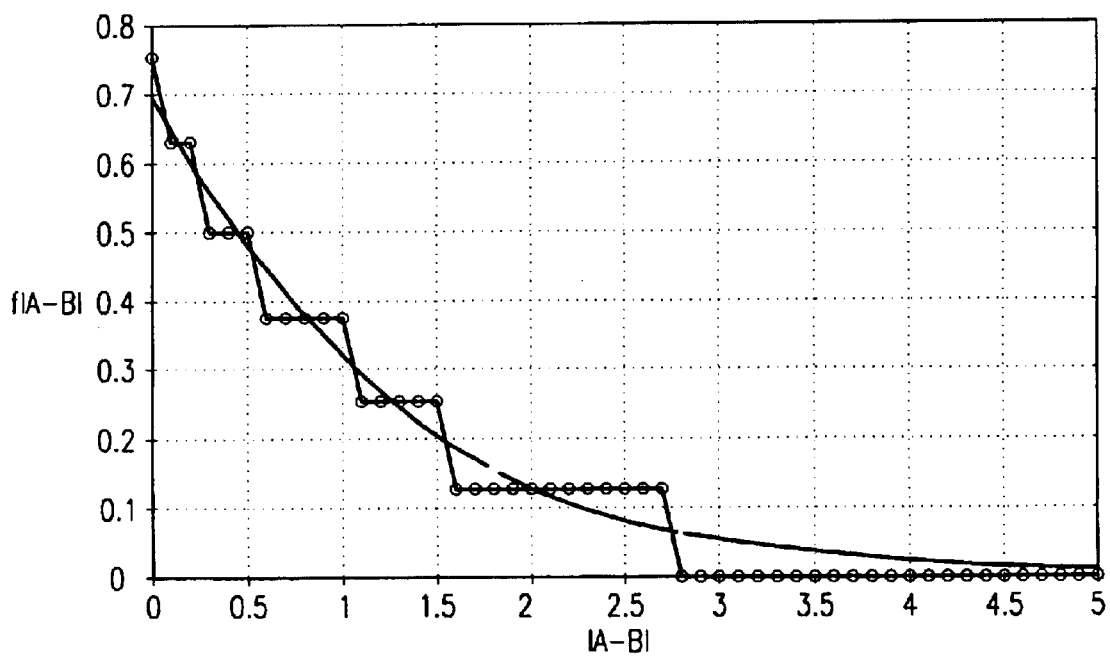
Figure 14:
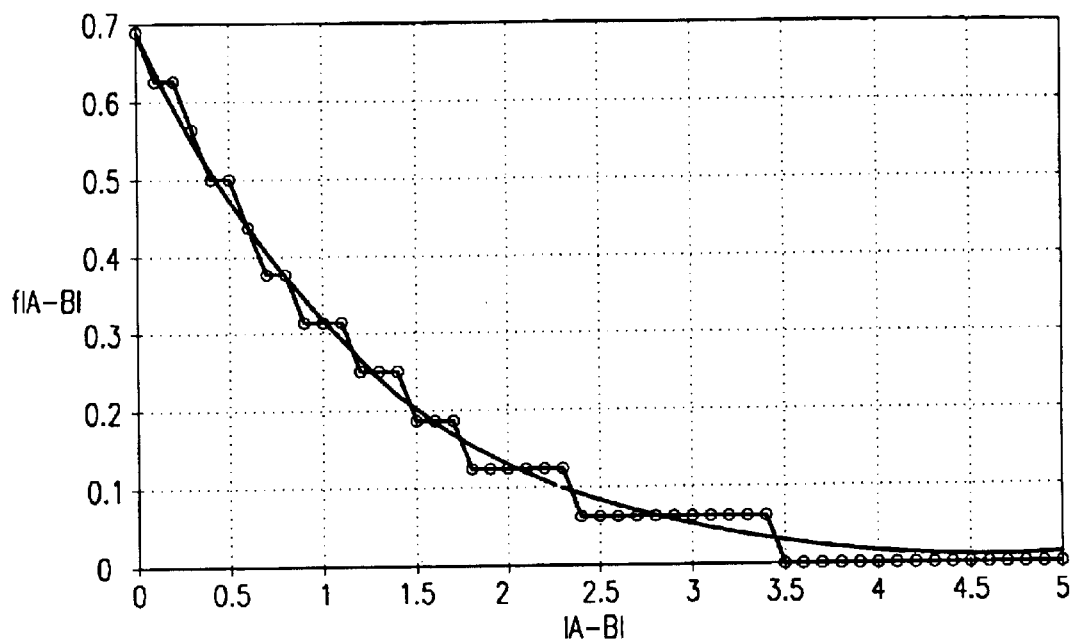
Figure 15:
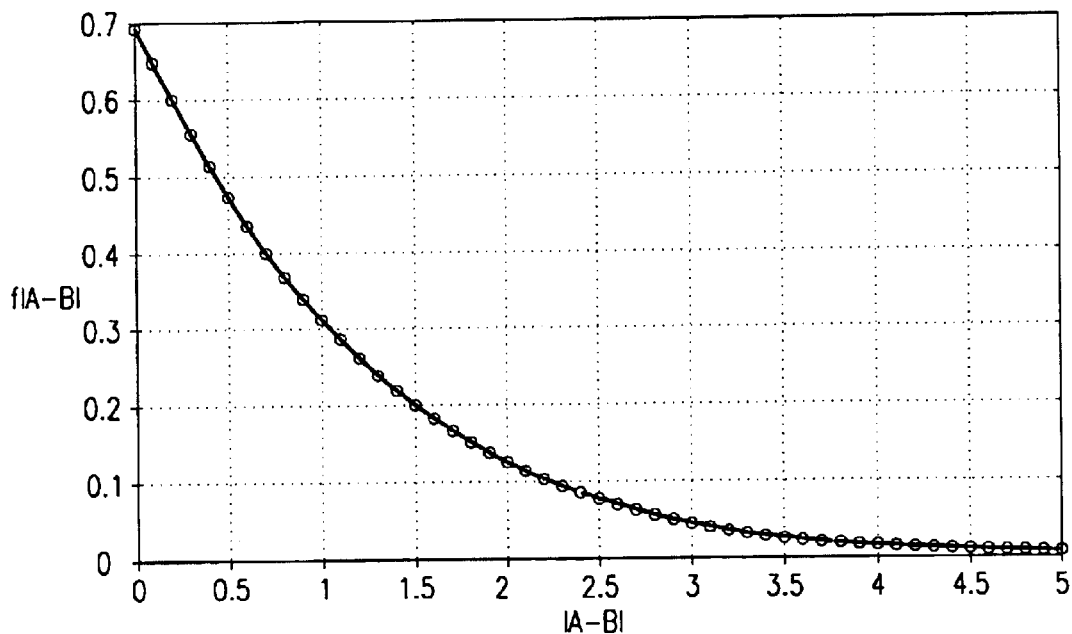

According to a preferred embodiment of the invention, the addition of a specialized instruction to perform the MAX star function provides a very efficient, low cost way to get better performance on the DSP. The instruction would have two inputs and one output as shown in FIG. 9 and is designed to fit in a standard 3-operand format(for example, A+B=C). This simple instruction is implemented on a DSP to take 1 cycle. FIG. 10 shows one possible implementation of the MAX star function 64. There are two inputs to the MAX star function 64, "A" and "B". "A" is the alpha block 58 input to the MAP decoder 34 of FIGS. 6 and 7 and "B" is the beta block 56 input to the MAP decoder 34 of FIGS. 6 and 7. Both inputs A and B consist of one each of inputs to the alpha $X_{n,f}$, $P_{n,f}$ and $W_{n,j,f}$, plus the 8 alpha state metrics $\alpha_n$ and beta blocks, $X_{n,r}$, $P_{n,r}$, and $W_{n,j,r}$, plus the 8 beta state metrics $\beta_{n,r}$ totaling 11 inputs total for each A and B inputs. The Signal m1 is the difference between inputs A and B. The sign of m1 controls the multiplexer of the MAX function, or if the sign of m1 is positive, then the multiplexer will choose the input with a positive sign and if the sign of m1 is negative, then the multiplexer will choose the input with a negative sign. Signal m2 is this result. Signal m1 is applied to a lookup table. The lookup table is built to handle both positive and negative results. Its output is m3 and is summed with m2 to form the MAX star result.

The size of the lookup table depends on the resolution required. FIGS. 11–15 illustrate a few examples of different fixpoint sizes for the lookup table. Implementing the MAX star circuit on a DSP will allow the DSP to execute the MAX star function in 1 clock cycle. This reduction will allow the turbo decoder to run more efficiently on the DSP; therefore reducing the price of the system by eliminating the dedicated turbo decoder chip.

FIGS. 11–15 illustrate two plots of the table lookup portion of the MAX star equation $f(|A-B|)=ln[1+e^{-|A-B|}]$. One plot is the floating point curve and the other plot is the fixed point plot. The fixed point sizes for the lookup table range from 1 bit to 8 bits resolution. As shown in the figures, the greater the number of bits represented in the table look-up, i.e. the greater the resolution of the table-look-up, the closer the approximation to the floating point curve.

For example, if the turbo decoder algorithm required only 1 bit resolution for the MAX star function, then the following code for the look-up table would be appropriate. This data can be extracted from FIG. 11.

if ((m1$\geq$0.0) and (m1$\leq$1.0) then
   m3=0.5
else if ((m1<0) and (m1$\leq$-1.0) then
   m3=0.5
else
   m3=0.0 end if

I claim:

1. A structure for performing a MAX star function of a first operand and a second operand comprising:

a subtractor having a first input receiving said first operand and a second input receiving said second operand for subtracting said second input from said first input and yielding a difference having either a positive or a negative sign result;

a multiplexer, having a first input receiving said first operand, a second input receiving said second operand, a control input receiving said difference from said subtractor and an output, said multiplexer selecting for output said first input if said difference has a positive sign result and said second input if said difference has a negative sign result;

a look-up table having an input receiving said difference from said subtractor including both said positive or negative sign result and an output, said look-up table storing at locations corresponding to each possible input an approximation of the function $\ln(1-e^{-|D|})$, where D is said difference of said subtractor, and recalling an entry corresponding to said input; and an adder having a first input receiving said output of said multiplexer, a second input receiving said output of said look-up table and an output, said adder for summing said output of said multiplexer and said output of said look-up table to produce a MAX Star output.

2. The structure for performing a MAX star function of claim 1, wherein:

said look-up table having a size of said input dependent upon a required resolution.

3. The structure for performing a MAX star function of claim 2, wherein:

said look-up table having a size of said output of 1 bit.

4. The structure for performing a MAX star function of claim 1, wherein:

said look-up table wherein
if said input is greater than or equal to 0.0 and less than or equal to 1.0, then said output is 0.5,
if said input is less than 0.0 and greater than or equal to −1.0, then said output is 0.5, and
if said input is greater than 1.0 or less than −1.0, then said output is 0.0.

5. The structure for performing a MAX star function of claim 1, wherein:

said look-up table wherein
if said input is greater than or equal to 0.0 and less than or equal to 0.3, then said output is 0.75,
if said input is less than 0.0 and greater than or equal to −0.3, then said output is 0.75,
if said input is greater than 0.3 and less than or equal to 0.8, then said output is 0.5,
if said input is less than −0.3 and greater than or equal to −0.8, then said output is 0.5,
if said input is greater than or equal to 0.8 and less than or equal to 2.1, then said output is 0.25,
if said input is less than −0.8 and greater than or equal to −2.1, then said output is 0.25,
if said input is greater than 2.1 or less than −2.2, then said output is 0.0.

6. The structure for performing a MAX star function of claim 1, wherein:

said look-up table wherein
if said input is greater than or equal to 0.0 and less than or equal to 0.1, then said output is 0.75,
if said input is less than 0.0 and greater than or equal to −0.1, then said output is 0.75,
if said input is greater than or equal to 0.1 and less than or equal to 0.3, then said output is 0.625,
if said input is less than −0.1 and greater than or equal to −0.3, then said output is 0.625,
if said input is greater than or equal to 0.3 and less than or equal to 0.6, then said output is 0.5,
if said input is less than −0.3 and greater than or equal to −0.6, then said output is 0.5,
if said input is greater than or equal to 0.6 and less than or equal to 1.1, then said output is 0.375,
if said input is less than −0.6 and greater than or equal to −1.1, then said output is 0.375,
if said input is greater than or equal to 1.1 and less than or equal to 1.6, then said output is 0.25,
if said input is less than 1.1 and greater than or equal to −1.6, then said output is 0.25,
if said input is greater than or equal to 1.6 and less than or equal to 2.3, then said output is 0.125,
if said input is less than −1.6 and greater than or equal to −2.3, then said output is 0.125, and
if said input is greater than 2.3 or less than −2.4, then said output is 0.0.

* * * * *